United States Patent
Lu et al.

(10) Patent No.: US 8,010,318 B2
(45) Date of Patent: Aug. 30, 2011

(54) SYSTEM AND METHOD TO DETERMINE ELECTRIC MOTOR EFFICIENCY NONINTRUSIVELY

(75) Inventors: Bin Lu, Kenosha, WI (US); Thomas G. Habetler, Snellville, GA (US); Ronald G. Harley, Lawrenceville, GA (US)

(73) Assignee: Eaton Corporation, Cleveland, OH (US)

( * ) Notice: Subject to any disclaimer, the term of this patent is extended or adjusted under 35 U.S.C. 154(b) by 631 days.

(21) Appl. No.: 12/132,151

(22) Filed: Jun. 3, 2008

(65) Prior Publication Data

US 2008/0300827 A1    Dec. 4, 2008

Related U.S. Application Data

(60) Provisional application No. 60/932,741, filed on Jun. 4, 2007, provisional application No. 60/959,459, filed on Jul. 13, 2007.

(51) Int. Cl.
*G01R 31/34* (2006.01)
*G01R 19/22* (2006.01)
*H02K 11/00* (2006.01)

(52) U.S. Cl. ............. 702/182; 318/490; 324/120

(58) Field of Classification Search ........... 702/182, 702/145; 318/490, 491, 561; 324/120, 122, 324/126
See application file for complete search history.

(56) References Cited

U.S. PATENT DOCUMENTS

2005/0067991 A1 *  3/2005  El-Ibiary ............ 318/490
2005/0071095 A1    3/2005  El-Ibiary

FOREIGN PATENT DOCUMENTS

| DE | 102006008048 A1 | 9/2006 |
| EP | 1755211 A | 2/2007 |
| JP | 04248389 A | 9/1992 |

OTHER PUBLICATIONS

Hurst et al., "A Comparison of Spectrum Estimation Techniques for Sensorless Speed Detection in Induction Machines," IEEE Transactions on Industry Applications, vol. 33, No. 4, Jul./Aug. 1997, pp. 898-905.

Hurst et al., "A Self-Tuning Closed-Loop Flux Observer for Sensorless Torque Control of Standard Induction Machines," IEEE Transactions on Power Electronics, vol. 12, No. 5, Sep. 1997, pp. 807-815.

(Continued)

*Primary Examiner* — Bryan Bui
(74) *Attorney, Agent, or Firm* — Ziolkowski Patent Solutions Group, SC

(57) ABSTRACT

A system and method for nonintrusively determining electric motor efficiency includes a processor programed to, while the motor is in operation, determine a plurality of stator input currents, electrical input data, a rotor speed, a value of stator resistance, and an efficiency of the motor based on the determined rotor speed, the value of stator resistance, the plurality of stator input currents, and the electrical input data. The determination of the rotor speed is based on one of the input power and the plurality of stator input currents. The determination of the value of the stator resistance is based on at least one of a horsepower rating and a combination of the plurality of stator input currents and the electrical input data. The electrical input data includes at least one of an input power and a plurality of stator input voltages.

25 Claims, 4 Drawing Sheets

OTHER PUBLICATIONS

Lee et al., "An On-line Stator Winding Resistance Estimation Technique for Temperature Monitoring of Line-connected Induction Machines," IEEE, 2001, pp. 1564-1571.

Hsu et al., "Comparison of Induction Motor Field Efficiency Evaluation Methods," IEEE Transactions on Industry Applications, vol. 34, No. 1, Jan./Feb. 1998, pp. 117-125.

"IEEE Standard Test Procedure for Polyphase Induction Motors and Generators," IEEE Standards, IEEE Power Engineering Society, New York, New York, Nov. 4, 2004.

Kueck et al., "Assessment of methods for estimating motor efficiency and load under field conditions," Oak Ridge National Laboratory report, ORNL/TM-13165, 1996.

Hurst et al., "Sensorless Speed Measurement Using Current Harmonic Spectral Estimation in Induction Machine Drives," IEEE Transactions on Power Electronics, vol. 11, No. 1, Jan. 1996, pp. 66-73.

* cited by examiner

SYSTEM AND METHOD TO DETERMINE ELECTRIC MOTOR EFFICIENCY NONINTRUSIVELY

CROSS-REFERENCE TO RELATED APPLICATION

This application claims the benefit of both prior U.S. Provisional Application Ser. No. 60/932,741 filed Jun. 4, 2007 and of prior U.S. Provisional Application Ser. No. 60/959,459 filed Jul. 13, 2007.

GOVERNMENT LICENSE RIGHTS

The present invention was made at least in part with Government support under Contract No. DE-FC36-04GO14000, awarded by the United States Department of Energy. The Government may have certain rights in the invention.

BACKGROUND OF THE INVENTION

The invention relates generally to the determination of an electric motor's operating efficiency while the motor is running without the need for any additional sensors, other than standard current and voltage sensors on the input side of the motor.

Motor-driven systems are generally believed to use a majority of the total electric energy produced. Of the total number of motor-driven systems in use, only a small fraction have their efficiency and health monitored. Due to the costs of conventional monitoring systems, the motor-driven systems that are monitored are often the costlier motors above 500 hp. However, motors below 200 hp make up a majority of the motors in service and consume a majority of the energy used by all motors in service. Further, these motors of 200 hp or below often operate at no more than 60% of their rated load because of oversized installations and/or under-loaded conditions. Consequently, many motors operate at a reduced efficiency, which results in wasted energy. Without an efficiency monitoring system, the wasted energy that results from a motor operating inefficiently often goes unnoticed. Accordingly, often the first step towards maximizing energy efficiency of a motor is to determine or measure the efficiency of the motor.

Systems for energy usage monitoring or efficiency evaluation of electric machines are important for overall energy savings. These systems are often expected to be implemented in an integrated product because of many common requirements such as data collections. At a fundamental level, energy efficiency of a motor can be determined by the ratio of a motor's power input to the motor's power output. Motor terminal voltages and currents are often used to determine a motor's power input. In industrial plants, the motor terminal voltages and currents are readily available from motor control centers (MCCs) that have potential transformers (PTs) and current transformers (CTs) preinstalled for protection purposes. Because of the PTs and CTs that are often preinstalled in MCCs, to measure terminal voltages and currents often brings no additional costs in terms of added sensors for data collection. As such, conventional efficiency monitoring systems often rely on the terminal voltages and currents as measured by the MCCs to determine input power. However, many traditional efficiency evaluation methods or monitoring systems also require the measurement of motor rotor speed and motor shaft torque so that motor output power may be calculated. Speed and torque transducers are commonly used to directly measure the motor rotor speed and shaft torque. However, such transducers pose problems because they add expenses in added hardware and costly installations that are highly intrusive requiring motor down-time, which is unacceptable in many industrial applications.

Further, it may not even be possible to install such transducers, or other measuring equipment, because either the motors are buried and inaccessible inside a machine or there is no space to attach such transducers between the motor and the load. As such, methods have been developed in which motors are taken offline or removed from service so that power output may be determined. Often, the motors are removed to a remote room where testing is implemented in a controlled environment. However, because many industrial processes cannot be interrupted, traditional methods that require a motor be removed from service to determine its efficiency cannot be used.

A possible approach of evaluating motor efficiency, while keeping a motor in-service or online and avoiding the use of output transducers, is to use the pre-measured motor characteristic efficiencies for representative load conditions. Such efficiencies are often measured during motor development, and are used to predict the motor efficiency while the motor is in operation, or while in-service. This approach is nonintrusive in nature; however, its usage in practice is greatly limited by the fact that 1) the characteristic efficiencies under representative load conditions are not always available from motor data sheets, and 2) the characteristic efficiencies are generic data for a line of motors. Being generic, such information could differ from actual efficiencies for a specific motor due to many factors, such as winding characteristics, wide tolerances, inaccurate nameplate information, and different working environments, to name just a few reasons.

Therefore, it would be desirable to design an apparatus and method to non-intrusively and accurately determine motor efficiency while such motor is in-service, without the need for any add-on sensors.

BRIEF DESCRIPTION OF THE INVENTION

In accordance with one aspect of the invention, a motor efficiency determination system includes a processor programmed to determine a plurality of stator input currents of a motor in operation, determine electrical input data of the motor in operation, determine a rotor speed of the motor in operation, determine a value of stator resistance of the motor in operation, and determine an efficiency of the motor in operation. The determination of the rotor speed is based on one of the input power and the plurality of stator input currents. The determination of the value of the stator resistance is based on at least one of a horsepower rating and a combination of the plurality of stator input currents with the electrical input data. The electrical input data includes at least one of an input power and a plurality of stator input voltages. In addition, the determination of the efficiency of the motor in operation is based on the determined rotor speed, the determined value of stator resistance, the plurality of stator input currents, and the determined electrical input data.

In accordance with another aspect of the invention, a computer readable storage medium having stored thereon a computer program comprising instructions, which, when executed by a computer, cause the computer to measure at least two stator input currents of an electric motor during an electric motor operation, measure at least one of an input power and a plurality of stator input voltages of the electric motor during the motor operation, and determine an instantaneous efficiency of the electric motor during the motor operation. The determination of the instantaneous efficiency is based on a rotor speed, a determination of a stator winding resistance, and the at least two stator input currents. The determination of the stator winding resistance is based on data free of measured stator winding resistance data.

In accordance with yet another aspect of the invention, a method of determining an instantaneous motor efficiency of an online motor in operation includes determining an input power of an online motor in operation, determining a rotor speed of the online motor in operation, and determining a stator winding resistance of the online motor in operation without measuring the stator winding resistance. The method further includes determining an output power of the online motor in operation based on the rotor speed and the stator winding resistance and determining an instantaneous motor efficiency of the online motor in operation based on the determination of the input power and the determination of the output power.

Various other features and advantages will be made apparent from the following detailed description and the drawings.

BRIEF DESCRIPTION OF THE DRAWINGS

The drawings illustrate several embodiments contemplated for carrying out the invention.

In the drawings.

DETAILED DESCRIPTION OF THE PREFERRED EMBODIMENT

Figure 1:
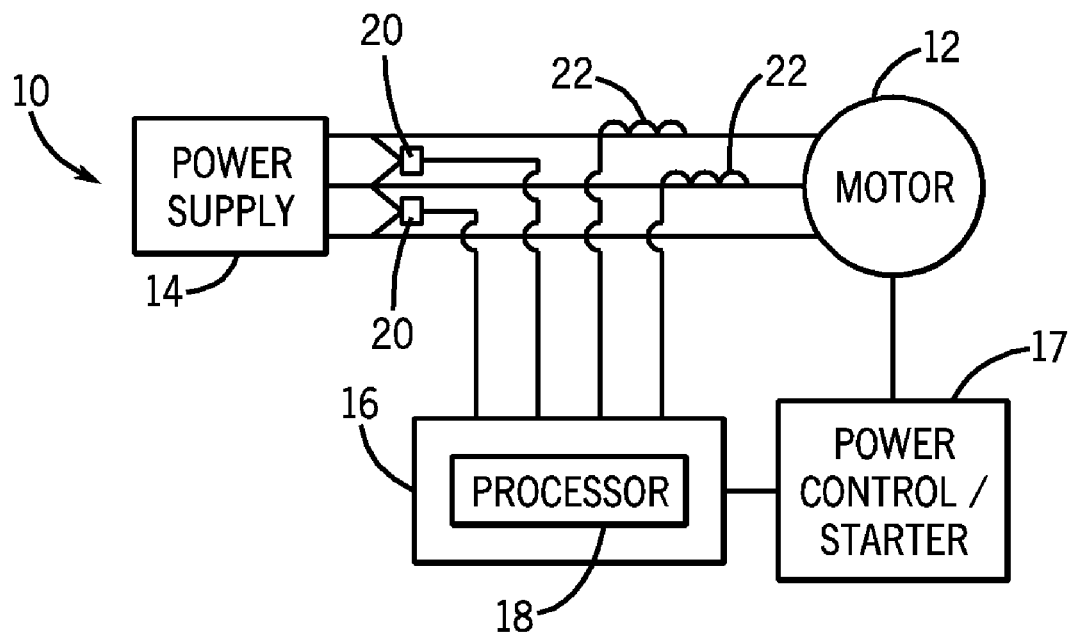
FIG. 1 is a block diagram of a system incorporating the invention.

Referring to FIG. 1, a block diagram of a system incorporating the present invention is shown. The system 10 includes a motor 12 that receives power from a power supply 14. The system 10 also includes a relay assembly 16 used to monitor as well as control operation of the motor in response to operator inputs or motor fault conditions. The motor 12 and the relay assembly 16 typically are coupled to electronic devices such as a power controller and/or a starter 17. The controller/starter 17 is connected to the motor 12. It is contemplated, however, that the power controller/starter may be connected in series between the power supply 14 and the motor 12. In a three-phase system, as shown in FIG. 1, the relay assembly 16 includes a processor 18 that, as will be described in greater detail with respect to FIGS. 2-5, determines motor efficiency while the motor 12 is in operation (i.e., operating online). Though the processor 18 is depicted as being included in the relay assembly 16, it is contemplated that a power control device such as the power controller/starter 17 may include the processor 18. The relay assembly 16 includes at least a pair of voltage sensors 20 and a pair of current sensors 22. As is generally known, voltage and current data may be acquired from only two of the phases of a three-phase motor as voltage and current data for the third phase may be extrapolated from the voltage and current data of the monitored two phases.

It is contemplated that embodiments of the invention may be implemented using a standalone monitoring and diagnostic unit such as the relay assembly 16 of FIG. 1 that includes the processor 18. However, it is also contemplated that embodiments of the invention may be implemented by using existing processors and sensors of a motor control center (MCC).

Figure 2:
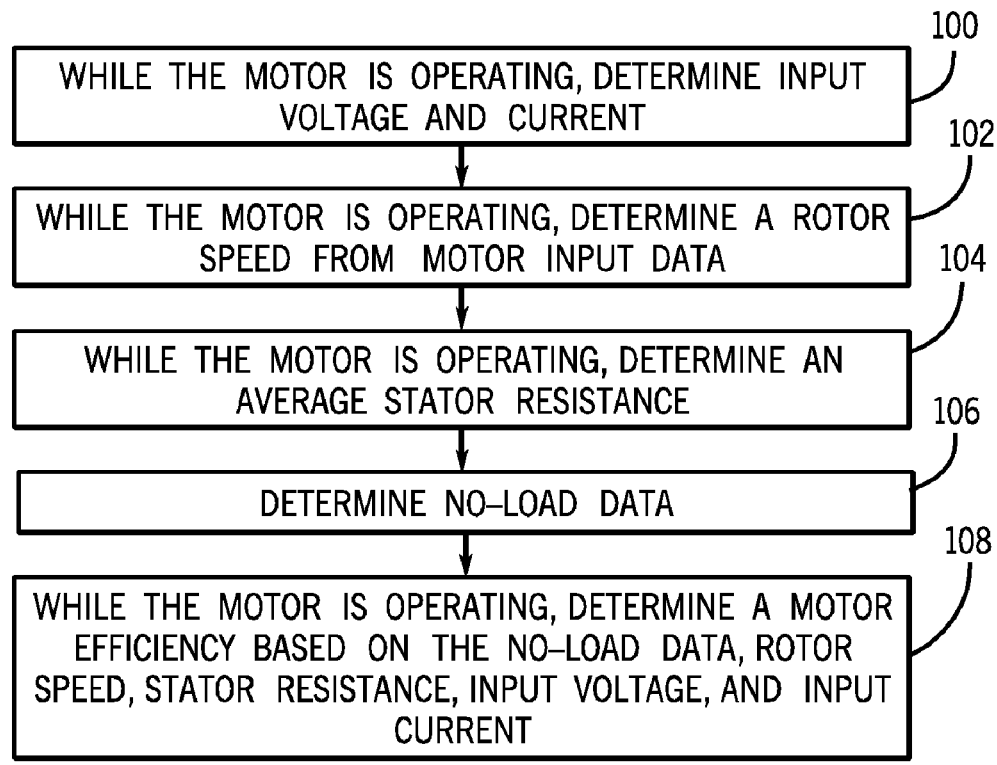
FIG. 2 is a flow chart depicting a technique for a nonintrusive determination of motor efficiency according to the invention.
Figure 3:
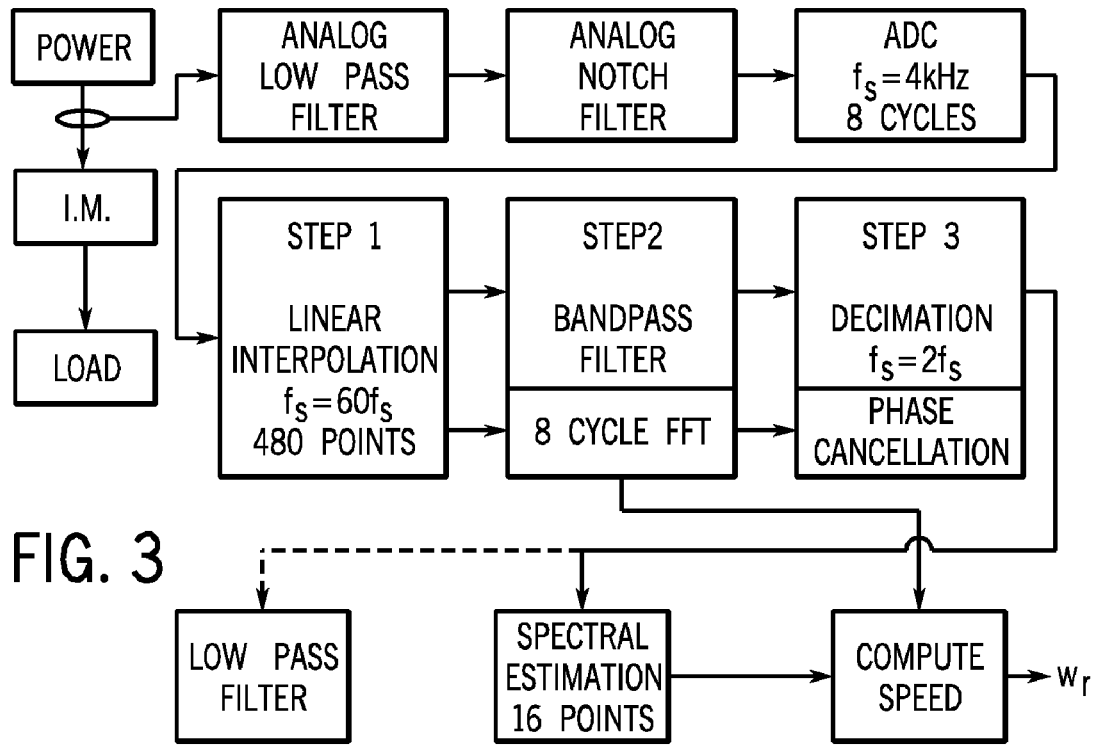
FIG. 3 is an exemplary signal processing diagram illustrating the determination of motor rotor speed used in one embodiment of the invention.

Referring to FIG. 2, a flowchart depicting a technique for a nonintrusive determination of motor efficiency according to one aspect of the invention is shown. In one embodiment, a plurality of input voltages and currents of the motor's stator are determined or measured while the motor is operating 100. For example, input currents and voltages may be determined using sensors at the input terminals of the motor, or at any convenient location upstream of the motor so as to easily acquire the input voltages and currents using sensors already in place. In yet another example, the input voltages and currents may be determined by using detectors or sensors to determine line-to-line voltages (e.g., see voltage sensors 20 and current sensors 22 of FIG. 1). Often, however, MCCs can be used to determine input voltages and currents using the potential transformers (PTs) and currents transformers (CTs) incorporated therein. Accordingly, if such an MMC is connected to a motor, voltage and current inputs can be gathered or determined therefrom.

In another embodiment, input power and one of a plurality of stator input voltages or input currents are determined or measured at 100, FIG. 2. That is, if a plurality of stator input voltages are determined, one skilled in the art will appreciate that the determined or measured input power may be used to determine the plurality of stator input currents. Likewise, if a plurality stator input currents are determined, one skilled in the art will appreciate that the determined or measure input power may be used to determine the plurality of stator input voltages.

Still referring to FIG. 2, after the determinations or measurements at 100, process control proceeds to determining rotor speed at 102. It is noted that, such rotor speed is determined while the motor is operating and online. Further, it is also noted that the rotor speed is determined using the determined or gathered input currents and motor or electrical input data such as voltages or a determined or gathered input power—not by using any speed transducers or other invasive devices.

In one embodiment, the rotor speed is determined, 102, using determined input voltages and currents and is based on current harmonics. That is, the determination at 102 may be based on the motor magnetic saliency harmonics, which arise from rotor slotting and eccentricity. For example, an initialization algorithm, as understood by those skilled in the art, may be used for determining the number of rotor slots and for determining an optimal set of numbers for k, air-gap MMF harmonics order, and an order of rotor eccentricity for the following equation:

$$f_{seh} = f_1 \left[ (kR + n_d) \frac{1-s}{p/2} + n_w \right],$$ (Eqn. 1)

where $f_{seh}$ is the frequency of rotor-related harmonic components; $f_1$ is the supply frequency; k=0, 1, 2, . . . ; R is the number of rotor slots; p is the number of poles; s is the motor slip; $n_d$=0, ±1, ±2, . . . , is the order of rotor eccentricity; and $n_w$=±1, ±3, . . . , is the air-gap MMF harmonics order. An example of an overall signal processing algorithm, which may used to determine the slot harmonic frequency, $f_{seh}$, is illustrated in the signal processing diagram of FIG. 3. After determining k, $n_d$, and $n_w$, a speed detection algorithm may use the following relationship to determine rotor speed:

$$s = 1 - \frac{p}{2} \cdot \frac{\frac{f_{seh}}{f_1} - n_w}{kR + n_d}. \qquad \text{(Eqn. 2)}$$

Here, the slip determination is independent of motor parameters, only requiring the number of poles, which may be obtained a priori. Such a determination provides a robust speed estimate down to approximately 1 Hz operation with a very high accuracy of within 5 rpm at high speeds and 0.005 p.u. slip at low speeds.

In another embodiment, the rotor speed, $\omega_r$, of a motor may determined, 102, FIG. 2, using a determined or calculated input power and nameplate data information according to the following relationship:

$$\omega_r = -(\omega_{syn} - \omega_{r\_rated}) \times \text{Load\_per} + \omega_{syn}, \qquad \text{(Eqn. 3)}$$

where $\omega_{syn}$ is the motor synchronous speed, $\omega_{r\_rated}$ is the rated motor speed that may be determined from motor nameplate information, and Load_per is the instantaneous load percentage. $\omega_{syn}$ may be determined from the following relationship:

$$\omega_{syn} = \frac{120 \times f_1}{p}, \qquad \text{(Eqn. 4)}$$

where p, which may be determined from nameplate data, is the motor pole number, and $f_1$ is, as with Eqn. 1, the fundamental frequency of the supply. Load_per, as used in Eqn. 3, may be determined from the following relationship:

$$\text{Load\_per} = \frac{P_{input}}{P_{input\_rated}} \times 100\%, \qquad \text{(Eqn. 5)}$$

where $P_{input}$ may be determined from data gathered from an input power meter. $P_{input\_rated}$, as seen in Eqn. 3, may be determined in accordance with the following relationship:

$$P_{input\_rated} = \frac{HP_{rated} \times 745.7}{\eta_{rated}}, \qquad \text{(Eqn. 6)}$$

where $HP_{rated}$ and $\eta_{rated}$ is the rated output power and the rated motor efficiency, respectively, and each may also be determined from nameplate data. Alternatively, $P_{input\_rated}$ may also be determined according to the following relationship:

$$P_{input\_rated} = \sqrt{3} \times V_{LL\_rated} \times I_{s\_rated} \times PF_{rated}, \qquad \text{(Eqn. 7)}$$

where $V_{LL\_rated}$ represents the rated line-to-line input voltage determined from motor nameplate, $I_{s\_rated}$ represents rated input phase current or Full Load Current determined from motor nameplate, and $PF_{rated}$ represents the rated motor power factor, also determined from motor nameplate data.

Accordingly, in light of Eqns. 3-7, the instantaneous motor speed, $\omega_r$, may be determined from only nameplate data and a determined motor input power, $P_{input}$. Other sensorless speed determinations that employ other techniques may be used in a manner consistent with embodiments of the invention.

As discussed above, rotor speed determinations may be made without a speed sensor. It is contemplated, however, that a speed sensor may be used to determine rotor speed. As such, a rotor speed determination such as the one discussed above with respect to Eqns. 1 and 2 may be used to verify a rotor speed determined from a sensor.

Figure 4:
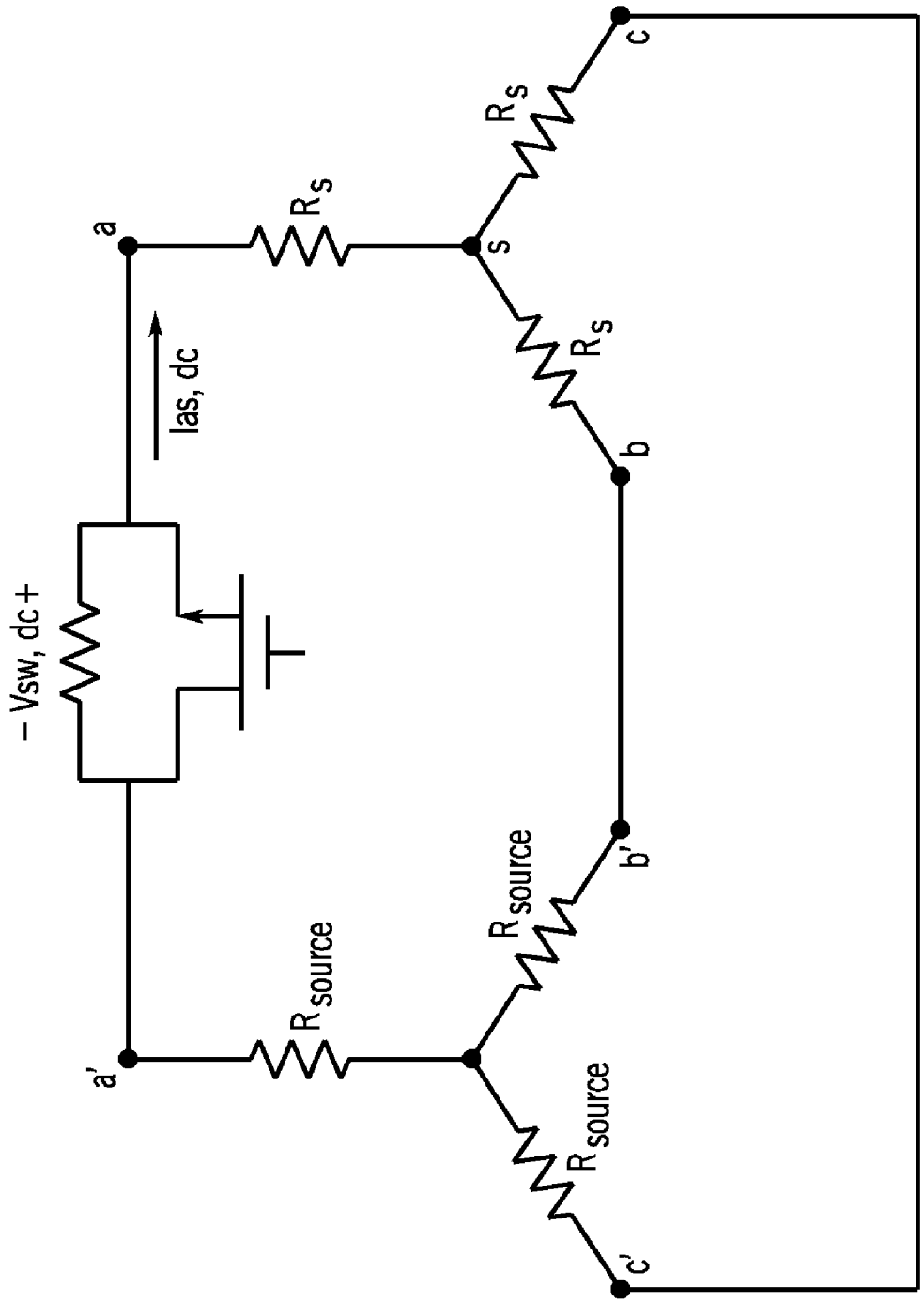
FIG. 4 is an equivalent circuit of a solid-state device used in determining stator resistance of a motor according to an embodiment of the invention.

Referring back to FIG. 2, upon determining rotor speed, without speed transducers or other invasive devices, process control proceeds to determine an average stator resistance of the three-phase motor at 104 while the motor is operating (i.e., while in-service or online). That is, a stator resistance for each phase of the three-phase motor is determined and then the three stator resistances are averaged to create the determined average stator resistance. Traditionally, a direct current resistance of a stator winding is measured through an unpowered test. However, according to at least one embodiment of the invention, direct current resistance of a stator winding can be determined while a motor remains powered. That is, according to this embodiment, an average stator resistance may be determined while the motor is in operation. An average stator resistance determination may be determined in a variety of ways. For example, in one embodiment, an injection circuit is utilized, where a solid state device such as a MOSFET controlled circuit is used to intermittently inject a controllable direct current bias into the motor, thus allowing the determination of stator resistance for each phase. An equivalent circuit structure of such a MOSFET controlled circuit is shown in FIG. 4. Such an embodiment allows for low power dissipation and torque distortion, and is capable of providing an accurate average stator resistance determination under motor startup, load variation, and abnormal cooling conditions. Further, in such an embodiment, the injection circuit can be installed in the MCC for mains-fed machines. Upon determining stator resistance with regard to each phase of a three-phase motor, an average of the three can be taken to determine the average stator resistance.

Still referring to FIG. 2, when drive-connected motors are used, another embodiment may be employed to determine average stator resistance at 104. As is known in the art, with drive-connected motors, an injection circuit is not needed since direct current signal injection can be implemented in a software mode by controlling the excitation signals. As such, by controlling excitation signals, an average stator resistance can be determined from induced direct-current components in the input voltages and/or currents.

Another embodiment for determining average stator resistance during motor operation without a direct-current signal injection circuit will now be described. For many alternating current motors, which are connected with, for example, drives, soft-starters, and advanced relays, such an additional signal injection device can be eliminated by non-intrusively determining stator resistance for each phase. In such an embodiment, stator resistance may be determined by injecting direct-current components in the motor stator winding by adjusting the switching of the semiconductor devices of motors, such as a thyristor, MOSFET, or IGBT. As such, the direct-current injection circuit may be eliminated. Upon determining stator resistance for each phase, an average stator resistance can be estimated or determined.

In the embodiment depicted in the flowchart of FIG. 2, the rotor speed determination, 102, precedes the average stator resistance determination, 104. It is contemplated, however, that the rotor speed could be determined anytime after the determination of input voltages and currents, 100, and before the motor efficiency determination, which will be described in greater detail below, at 108.

Still referring to FIG. 2, after the determinations at 104 are complete, process control proceeds to determining no-load data at 106. No load data includes no-load current and no-load losses. Further, the no-load losses include windage and friction losses and stray-load loss. As will be described more fully below, the invention is capable of determining motor efficiencies for three-phase motors using determined no-load input current, measured input currents, and measured input voltages.

No-load input current may be determined at 106 in a variety ways. For example, no-load input current can be measured when a motor is operating under a no-load condition. On the other hand, however, no-load current may be estimated as a fixed percentage of the motor nominal current (e.g. 25%-30% of the nominal current) for small and medium motors (e.g., motors less than 200 horsepower). For larger motors, the percentage is often lower.

No-load current may also be determined using a priori data from a source such as the Motor Master Database data maintained by the United States Department of Energy or other databases. As such, no-load current may be determined at 106 either via measurement or by using a priori database information.

In yet another embodiment, no-load input current may be determined from the no-load losses using the following relationship:

$$P_{input\_nl} = (3.5 \sim 4.2) \times HP \times 745.7/100, \quad \text{(Eqn. 8)}$$

where $P_{input\_nl}$ is the no-load loss that is estimated, as shown, as a fixed percentage of the rated output power (e.g. 3.5%-4.2% of the rated output power per the Ontario Hydro Modified Method E), and HP is the rated motor output horsepower.

With regard to the no-load losses that are included in the determination of no-load data at 106, friction and windage losses, $W_{fw}$, may be estimated as a fixed percentage of the rated output power (e.g. 1.2% of the rated output power), as shown in the following relationship:

$$W_{fw} = 1.2 \times HP \times 745.7/100. \quad \text{(Eqn. 9)}$$

Further, the rated stray-load loss, $W_{LL\_rated}$, may be estimated, according to IEEE standard 112, as a fixed percentage of the rated output power as shown below in the Table 1.

TABLE 1

| Machine HP Rating | | Stray-load Loss Percent of Rated Output |
|---|---|---|
| 1-125 hp | 1-90 kW | 1.8% |
| 126-500 hp | 91-375 kW | 1.5% |
| 501-2499 hp | 376-1850 kW | 1.2% |
| 2500 hp and up | 1851 kW and up | 0.9% |

As shown above, losses are often based on a fixed percentage of the motor horsepower rating. Horsepower ratings may be found in a variety of databases or may be gathered from nameplate data.

Still further, as will be shown below with respect to Eqns. 10 and 11, rotor stray-load loss, $W_{LLr}$, may be determined from the motor stator input no-load current, $I_{s\_nl}$, rated rotor current, $I_{r\_rated}$, and rotor current, $I_r$. Before discussing the determination of $W_{LLr}$, examples for determining each variable will be described below.

With regard to the motor stator input no load current, $I_{s\_nl}$, upon determining $P_{input\_nl}$, $W_{fw}$, and $W_{LL\_rated}$, the root mean square (RMS) value of the motor stator input no-load current, $I_{s\_nl}$, may be estimated or determined according to the following relationship:

$$I_{s\_nl} = \sqrt{\frac{P_{input\_nl} - W_{fw} - W_{LL\_rated}}{3 * R_s}}, \quad \text{(Eqn. 10)}$$

where, $R_s$ is the stator resistance value that may be determined from a variety of motor databases, or from the motor voltage and current (e.g., see determination of average stator resistance at 104).

The rated rotor current, $I_{r\_rated}$, which may be used to determine the rotor stray-load loss, may be estimated or determined using rated input current, $I_{s\_rated}$, and the input stator no-load current $I_{s\_nl}$, according to the following relationship:

$$I_{r\_rated} = \sqrt{I_{s\_rated}^2 - I_{s\_nl}^2}. \quad \text{(Eqn. 11)}$$

In addition, the rotor current, $I_r$, which also may be used to determine the rotor stray-load loss, may be estimated or determined under any load condition using the input current, $I_s$, and the stator no-load current $I_{s\_nl}$, according to the following relationship:

$$I_r = \sqrt{I_s^2 - I_{s\_nl}^2}. \quad \text{(Eqn. 12)}$$

As such, with the understanding that $W_{LL\_rated}$, discussed above with respect to Table 1, is often estimated to be equivalent to the rated rotor stray-load loss, $W_{LLr\_rated}$, the rotor stray-load loss, $W_{LLr}$, may be determined at any load condition according to the following relationship:

$$W_{LLr} = W_{LLr\_rated} \times \left(\frac{I_r}{I_{r\_rated}}\right)^2. \quad \text{(Eqn. 13)}$$

Accordingly, the determination of no-load data at 106 may include the determination of windage and friction loss, $W_{fw}$, and rotor stray-load loss, $W_{LLr}$.

As depicted in the embodiment of FIG. 2 the determination of no-load data, 106, occurs after the determination of the stator resistance at 104. It is contemplated, however, that the no-load data, 106, could be determined before the determination of stator resistance, 104. That is, if a stator resistance determination is not used in the determination of no-load data, the determination of no-load data, 106, may occur prior to the determination of stator resistance, 104, and after the determination of input voltages and currents at 100.

As mentioned above, the determination of motor efficiency occurs at 108 in the embodiment of FIG. 2. Such an efficiency estimation or determination is considered an instantaneous motor efficiency determination. In one embodiment, the following relationship may be used to determine motor efficiency at 108:

$$\eta = \frac{P_{output}}{P_{input}}, \quad \text{(Eqn. 14)}$$

where η is motor efficiency, $P_{output}$ is the power output of the motor, and $P_{input}$ is the power input of the motor. In one embodiment that will be discussed below with respect to FIG. 5, the motor efficiency determination of 108 is based on an air-gap torque technique. In light of the manner in which the motor power input and motor power output may be determined, motor efficiency may be estimated without any output sensing devices.

Figure 5:
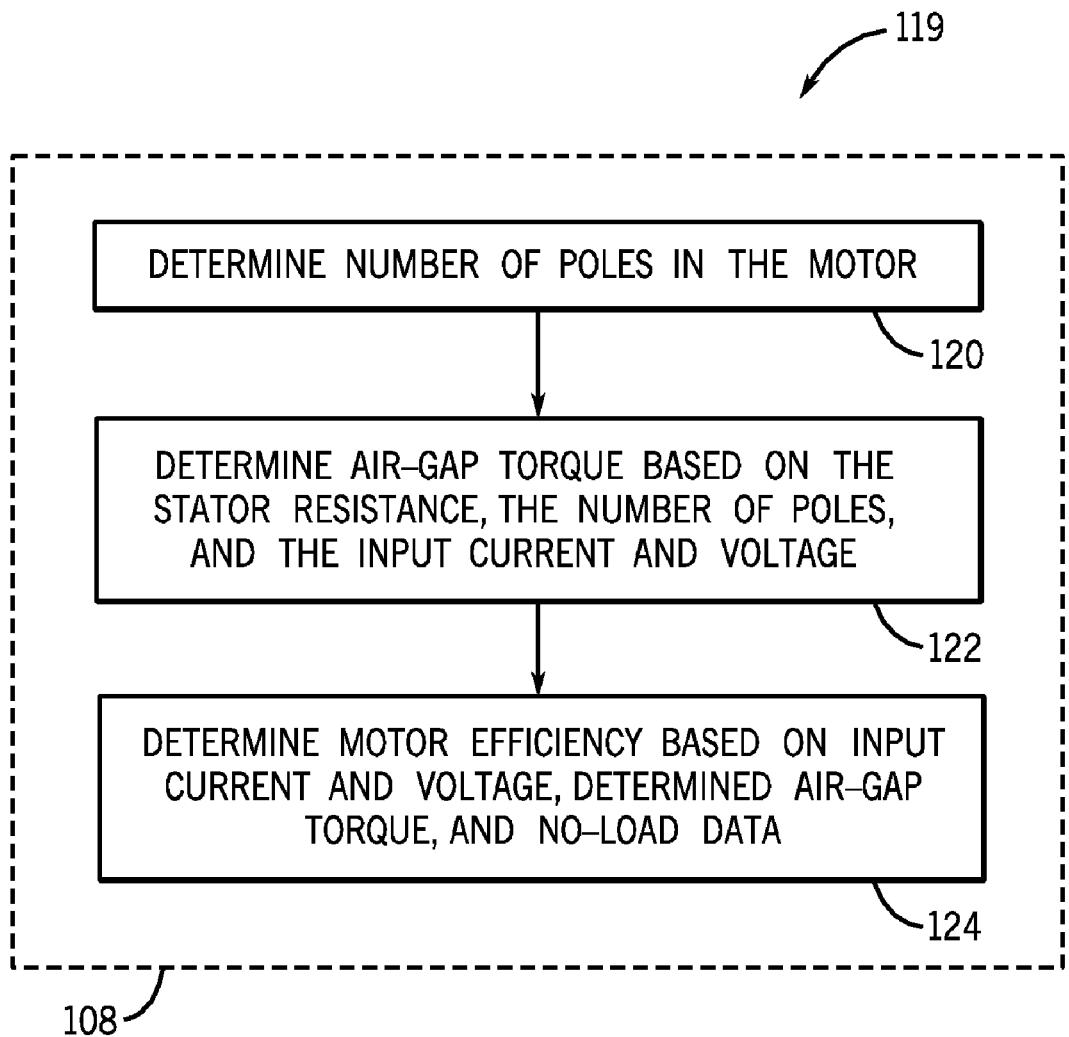
FIG. 5 is a flow chart depicting a technique for the determination of the motor efficiency set forth in FIG. 2 according to an embodiment of the invention.

Referring now to FIG. 5, a flowchart depicts technique 119 for the in-service or online determination of motor efficiency 108 according to an embodiment of the invention. More particularly, an air-gap torque technique 119 for determining a motor efficiency is shown. According to technique 119, the number of poles of the motor is determined from a priori information at 120. Upon determining the number of motor poles at 120, process control proceeds to determine the air-gap torque of the motor, 122. In one embodiment, the determination of the air-gap torque at 122 is based on determined average stator resistances, as in step 104 of FIG. 2, the number of motor poles, as in step 120 of FIG. 5, and/or the determined or measured input voltages and currents, as in step 100 of FIG. 2.

The invention may determine the air-gap torque for all three-phase motors with three wires, or all three-phase motors with four wires, where a fourth wire is a neutral wire. The air-gap torque, $T_{ag}$, for the directly above-mentioned three-phase motors, can be derived as follows:

$$T_{ag} = \frac{p}{2} |\lambda_{dqs} \times i_{dqs}|, \qquad \text{(Eqn. 15)}$$

where $\lambda_{dqs}$ is the total flux linkage space vector and $i_{dqs}$ is the stator current space vector in the d-q system. As such, the air-gap torque, $T_{ag}$, can be determined using the following relationship in the 3-phase system:

$$T_{ag} = \frac{\sqrt{3}}{6} p \left\{ \begin{array}{l} (i_a - i_b) \cdot \int [v_{ca} + R_s(2i_a + i_b)] dt + \\ (2i_a + i_b) \cdot \int [v_{ab} - R_s(i_a - i_b)] dt \end{array} \right\}, \qquad \text{(Eqn. 16)}$$

where p is the number of poles determined at 120 of FIG. 5. Further, $R_s$ represents the determined average stator resistance, 104 of FIG. 2. As evident from Eqn. 16, when $R_s$ is found, $T_{ag}$ may be determined using only two voltage sensors (e.g., voltage sensors 20 of FIG. 1) and two current sensors (e.g., current sensors 22 of FIG. 1). The integrals in Eqn. 16 represent the corresponding flux linkages. Further, as seen in Eqn. 16, the determination of the air-gap torque is free of phasor computations. In addition, since the sampling frequency of motor voltages and currents is usually large (greater than 2 kHz), a simple trapezoidal integration method can be used. Other numerical integration methods, e.g. Simpson's rules, can also be applied.

Upon or during determination of the air-gap torque at 122, process control then determines motor efficiency at 124. In one embodiment, as mentioned above with respect to Eqn. 14, motor efficiency is equivalent to the ratio of motor power output to motor power input. Motor power input may, for example, be determined from a power meter or the like. In another example, motor power input may be determined according to the following relationship:

$$P_{input} = -v_{ca}(i_a + i_b) - v_{ab} i_b, \qquad \text{(Eqn. 17)}$$

where $v_{ca}$ and $v_{ab}$ may be determined using motor terminal voltage detectors, line-to-line voltage detectors, or the like. Likewise, $i_a$ and $i_b$ may be determined using motor terminal current detectors, line current detectors, or the like. The motor power output, on the other hand, may be determined or estimated using the following relationship:

$$P_{output} = T_{shaft} \cdot \omega_r, \qquad \text{(Eqn. 18)}$$

where $T_{shaft}$ is the motor shaft torque and $\omega_r$ is the rotor speed (see Eqns. 1-2 and 3-7). The motor shaft torque, $T_{shaft}$, may be determined using the following relationship:

$$T_{shaft} = T_{ag} - \frac{W_{fw}}{\omega_r} - \frac{W_{LLr}}{\omega_r}. \qquad \text{(Eqn. 19)}$$

In light of Eqns. 16-19 above, motor power output can be determined or estimated according to the following relationship:

$$P_{output} = T_{ag} \cdot \omega_r - W_{fw} - W_{LLr}. \qquad \text{(Eqn. 20)}$$

That is, power output may be determined from the determined air-gap torque, $T_{ag}$, rotor speed, $\omega_r$, and no-load losses (e.g., $W_{fw}$ and $W_{LLr}$ determined at 106). If the motor is of the permanent magnetic (PM) or synchronous type, the rotor stay-load loss, $W_{LLr}$, can be considered to go to zero. Otherwise, if applicable, $W_{LLr}$ and $W_{fw}$ may be determined from nameplate information or other accessible resources as discussed above with respect to 106, $T_{ag}$ and $\omega_r$ may be determined from input voltages and currents as discussed above.

Accordingly, by measuring motor power input and determining motor power output, motor efficiency, $\eta$, may be determined at 124 according to, for example, Eqn. 14. As such, the motor efficiency determination at 124 may be based on input stator current and voltage and/or power, determined average stator resistance, and a determined rotor speed. In other words, the motor efficiency may be determined, 124, from input voltage and current, air-gap torque, and no-load data. Accordingly, it is seen that in light of the information used to settle Eqns. 1-20 above, motor efficiency can be determined, 124, merely from nameplate data, input voltage, and input current. As such, the present invention allows for accurate efficiency determination of a motor in operation (i.e., online), without any rotor speed or torque sensing devices, or any other sensing devices that need to be intrusively placed within the motor or on the output of the motor. If nameplate data, input voltage, and input current are obtained from a motor control device such as an MCC, the motor efficiency may be determined, 124, remotely.

A technical contribution for the disclosed method and apparatus is that is provides for a processor implemented to determine a motor efficiency based on nonintrusive techniques that rely on measured input current and voltage and a determination of output power.

In accordance with one embodiment, a motor efficiency determination system includes a processor programmed to determine a plurality of stator input currents of a motor in operation, determine electrical input data of the motor in operation, determine a rotor speed of the motor in operation, determine a value of stator resistance of the motor in operation, and determine an efficiency of the motor in operation. The determination of the rotor speed is based on one of the input power and the plurality of stator input currents. The determination of the value of the stator resistance is based on at least one of a horsepower rating and a combination of the plurality of stator input currents and the electrical input data. The electrical input data includes at least one of an input power and a plurality of stator input voltages. In addition, the determination of the efficiency of the motor in operation is based on the determined rotor speed, the determined value of stator resistance, the plurality of stator input currents, and the determined electrical input data.

In accordance with another embodiment, a computer readable storage medium having stored thereon a computer program comprising instructions, which, when executed by a computer, cause the computer to measure at least two stator input currents of an electric motor during an electric motor operation, measure at least one of an input power and a plurality of stator input voltages of the electric motor during the motor operation, and determine an instantaneous efficiency of the electric motor during the motor operation. The determination of the instantaneous efficiency is based on a rotor speed, a determination of a stator winding resistance, and the at least two stator input currents. The determination of the stator winding resistance is based on data free of measured stator winding resistance data.

In accordance with yet another embodiment, a method of determining an instantaneous motor efficiency of an online motor in operation includes determining an input power of an online motor in operation, determining a rotor speed of the online motor in operation, and determining a stator winding resistance of the online motor in operation without measuring the stator winding resistance. The method further includes determining an output power of the online motor in operation based on the rotor speed and the stator winding resistance and determining an instantaneous motor efficiency of the online motor in operation based on the determination of the input power and the determination of the output power.

The invention has been described in terms of embodiments, and it is recognized that equivalents, alternatives, and modifications, aside from those expressly stated, are possible and within the scope of the appending claims.

What is claimed is:

1. A motor efficiency determination system comprising:
   a processor programmed to:
      determine a plurality of stator input currents of a motor in operation;
      determine electrical input data of the motor in operation, wherein the electrical input data comprises at least one of an input power and a plurality of stator input voltages;
      determine a rotor speed of the motor in operation based on one of the input power and the plurality of stator input currents;
      determine a value of stator resistance of the motor in operation based on at least one of a horsepower rating and a combination of the plurality of stator input currents with the electrical input data; and
      determine an efficiency of the motor in operation based on the determined rotor speed, the determined value of stator resistance, the determined plurality of stator input currents, and the determined electrical input data.

2. The motor efficiency determination system of claim 1 wherein the electrical input data and the plurality of stator input voltages are determined with sensors external to the motor.

3. The motor efficiency determination system of claim 1 wherein the efficiency of the motor is determined without any sensing device internal to the motor and without a sensing device attached to a shaft of the motor.

4. The motor efficiency determination system of claim 1 wherein the processor is further programmed to send a command to inject a direct-current voltage into a stator winding of the motor in operation such that a plurality of direct-current components are induced into the plurality of stator input voltages and currents; wherein the determination of the value of stator resistance is further based on the plurality of induced direct-current components.

5. The motor efficiency determination system of claim 1 further comprising a solid-state device controlled circuit configured to inject a direct current signal into a stator winding of the motor in operation such that a plurality of direct-current components are induced into the plurality of stator input voltages and currents; wherein the determination of the value of stator resistance is further based on the plurality of induced direct-current components.

6. The motor efficiency determination system of claim 1 further comprising a motor control device configured to inject a direct current signal into a stator winding of the motor in operation such that a plurality of direct-current components are induced into the plurality of stator input voltages and currents; wherein the determination of the value of stator resistance is further based on the plurality of induced direct-current components.

7. The motor efficiency determination system of claim 1 wherein the determination of the efficiency of the motor is further based on a horsepower rating of the motor.

8. The motor efficiency determination system of claim 1 wherein the motor is free of speed and torque transducers.

9. The motor efficiency determination system of claim 1 wherein the motor efficiency determination of the motor in operation is further based on a determination of an air-gap torque of the motor.

10. The motor efficiency determination system of claim 9 wherein the air-gap torque ($T_{ag}$) is determined by $T_{ag}=p/2|\lambda_{dqs} \times i_{dqs}|$, where p is the number of motor poles, $\lambda_{dqs}$ is the total flux linkage space vector and $i_{dqs}$ is the stator current space vector in a d-q system.

11. The motor efficiency determination system of claim 9 wherein the determination of the air-gap torque is free of phasor computations.

12. The motor efficiency determination system of claim 1 wherein the processor is further programmed to determine a plurality of no-load losses and no-load current based on at least one of a Motor Master Database and a fixed percentage of a motor horsepower rating.

13. The motor efficiency determination system of claim 1 wherein the processor is further programmed to determine a motor stray-load loss based on a motor horsepower rating and IEEE Standard 112.

14. The motor efficiency determination system of claim 1 wherein the processor is further programmed to determine a combination of mechanical friction and windage losses based on a percentage of a motor horsepower rating.

15. The motor efficiency determination system of claim 1 further comprising:
   a motor that receives power from a power supply; and
   a relay assembly to monitor and control operation of the motor, the relay assembly including the processor therein.

16. The motor efficiency determination system of claim 1 wherein the processor is further programmed to control operation of the motor based, in part, on the determined instantaneous motor efficiency.

17. A non-transitory computer readable storage medium having stored thereon a computer program comprising instructions, which, when executed by a computer, cause the computer to:
   measure at least two stator input currents of an electric motor during an electric motor operation;

measure at least one of an input power and a plurality of stator input voltages of the electric motor during the motor operation;

determine a rotor speed and a stator winding resistance of the electric motor;

determine an instantaneous efficiency of the electric motor during the motor operation based on the rotor speed, the stator winding resistance, and the at least two stator input currents; and wherein the determination of the stator winding resistance is based on data free of measured stator winding resistance data obtained from a separate invasive sensing device.

18. The non-transitory computer readable storage medium of claim 17 wherein the rotor speed comprises rotor speed data free of measured rotor speed data.

19. The non-transitory computer readable storage medium of claim 17 wherein the determination of the instantaneous motor efficiency is further based on a determination of an air-gap torque of the electric motor.

20. The non-transitory computer readable storage medium of claim 17 wherein the electric motor is one of a three-phase electric motor having three wires and a three-phase electric motor having four wires comprising a neutral wire.

21. A computerized method of determining an instantaneous motor efficiency of an online motor in operation comprising:

receiving motor related data from an online motor in operation;

determining an input power of the online motor in operation from the motor related data;

determining a rotor speed of the online motor in operation from the motor related data;

determining a stator winding resistance of the online motor in operation from the motor related data, without measuring the stator winding resistance by way of a separate invasive sensing device;

determining an output power of the online motor in operation based on the rotor speed and the stator winding resistance;

determining an instantaneous motor efficiency of the online motor in operation based on the determination of the input power and the determination of the output power; and controlling operation of the motor based, in part, on the determined instantaneous motor efficiency.

22. The method of claim 21 wherein determining the rotor speed further comprises determining the rotor speed independent of a rotor speed measurement and independent of a voltage and current determination.

23. The method of claim 21 wherein determining the output power further comprises determining the output power without measuring the rotor speed.

24. The method of claim 21 further comprising estimating an air-gap torque of the online motor in operation.

25. The method of claim 21 wherein determining the instantaneous motor efficiency further comprises determining the instantaneous motor efficiency based on at least one of nameplate information and database information.

* * * * *